(12) United States Patent
Lo et al.

(10) Patent No.: US 6,825,672 B1
(45) Date of Patent: Nov. 30, 2004

(54) CABLE TESTER

(75) Inventors: William Lo, Cupertino, CA (US); Yiqing Guo, Cupertino, CA (US)

(73) Assignee: Marvell International Ltd., Hamilton (BM)

(*) Notice: Subject to any disclaimer, the term of this patent is extended or adjusted under 35 U.S.C. 154(b) by 67 days.

(21) Appl. No.: 10/165,467

(22) Filed: Jun. 7, 2002

(51) Int. Cl.[7] .............................................. G01R 31/11
(52) U.S. Cl. ........................................ 324/533; 324/534
(58) Field of Search .............................. 324/534, 532, 324/533, 535, 522, 523, 527, 538

(56) References Cited

U.S. PATENT DOCUMENTS 5,461,318 A * 10/1995 Borchert et al. ............ 324/533

OTHER PUBLICATIONS

Intel, "LXT9784 Octal 10/100 Tranceiver Hardware Integrity Function Overview" Application Note, Jan. 2001.

* cited by examiner

Primary Examiner—Anjan Deb
Assistant Examiner—Donald M. Lair (57) ABSTRACT

A cable testing system and method tests cable and determines status, cable length and reflection amplitude. The test module includes a pretest state machine that senses activity on the cable and enables testing if activity is not detected for a first period. A test state machine is enabled by the pretest state machine, transmits a test pulse on the cable, measures a reflection amplitude and calculates a cable length. The test module determines the status based on the measured amplitude and the calculated cable length. A lookup table includes a plurality of sets of reflection amplitudes as a function of cable length. The test module determines the status using the lookup table, the reflection amplitude and the cable length.

89 Claims, 5 Drawing Sheets

CABLE TESTER

FIELD OF THE INVENTION

The present invention relates to electronic diagnostic systems, and more particularly to testing equipment for cable used in a network.

BACKGROUND OF THE INVENTION

One goal of a network manager is to control total cost of ownership of the network. Cabling problems can cause a significant amount of network downtime and can require troubleshooting resources, which increase the total cost of ownership. Providing tools that help solve cabling problems more quickly will increase network uptime and reduce the total cost ownership.

Figure 1:
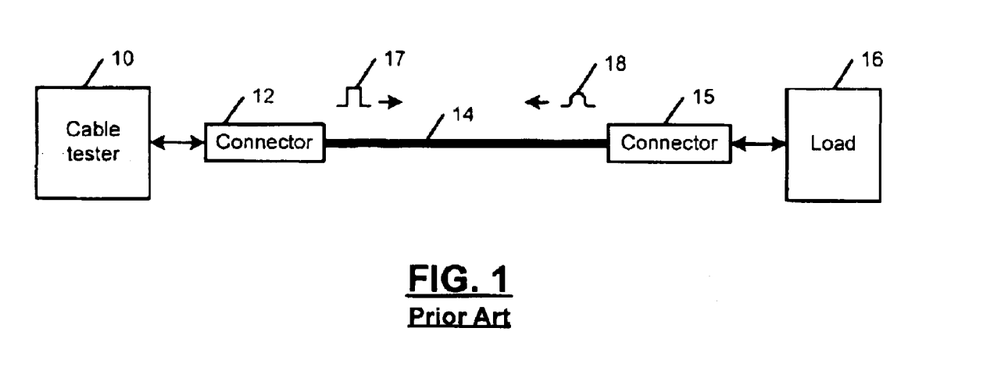
FIG. 1 is a functional block diagram of a cable tester according to the prior art.

Referring now to FIG. 1, conventional cable testers 10 are frequently used to isolate cabling problems. The cable testers 10 are coupled by a connector 12 (such as an RJ-45 or other connector) to a cable 14. A connector 15 connects the cable to a load 16. Conventional cable testers typically require the load 16 to be a remote node terminator or a loop back module. Conventional cable tests may generate inaccurate results when the cable is terminated by an active link partner that is generating link pulses during a test. The cable tester 10 performs cable analysis and is able to detect a short, an open, a crossed pair, or a reversed pair. The cable tester 10 can also determine a cable length to a short or open.

A short condition occurs when two or more lines are short-circuited together. An open condition occurs when there is a lack of continuity between ends at both ends of a cable. A crossed pair occurs when a pair is connected to different pins at each end. For example, a first pair is connected to pins 1 and 2 at one end and pins 3 and 6 at the other end. A reversed pair occurs when two ends in a pair are connected to opposite pins at each end of the cable. For example, a line on pin 1 is connected to pin 2 at the other end. A line on pin 2 is connected to pin 1 at the other end.

The cable tester 10 employs time domain reflection (TDR), which is based on transmission line theory, to troubleshoot cable faults. The cable tester 10 transmits a pulse 17 on the cable 14 and measures an elapsed time until a reflection 18 is received. Using the elapsed time and a cable propagation constant, a cable distance can be estimated and a fault can be identified. Two waves propagate through the cable 14. A forward wave propagates from a transmitter in the cable tester 10 towards the load 16 or fault. A return wave propagates from the load 16 or fault to the cable tester 10.

A perfectly terminated line has no attenuation and an impedance that is matched to a source impedance. The load is equal to the line impedance. The return wave is zero for a perfectly terminated line because the load receives all of the forward wave energy. For open circuits, the return wave has an amplitude that is approximately equal to the forward wave. For short circuits, the return wave has a negative amplitude is also approximately equal to the forward wave.

In transmission line theory, a reflection coefficient is defined as:

$$T_L = \frac{R\_wave}{F\_wave} = \frac{V_-}{V_+} = \frac{Z_L - Z_O}{Z_L + Z_O}$$

Where $Z_L$ is the load impedance and $Z_o$ is the cable impedance. The return loss in (dB) is defined as:

$$R_L(db) = 20\text{LOG}_{10}\left|\frac{1}{T_L}\right| = 20\text{LOG}_{10}\left|\frac{Z_L + Z_O}{Z_L - Z_O}\right|$$

Return loss performance is determined by the transmitter return loss, the cable characteristic impedance and return loss, and the receiver return loss. IEEE section 802.3, which is hereby incorporated by reference, specifies receiver and transmitter minimum return loss for various frequencies. Additional factors that may affect the accuracy of the return loss measurement include connectors and patch panels. Cable impedance can also vary, for example CAT5 UTP cable impedance can vary ±15 Ohms.

SUMMARY OF THE INVENTION

A cable testing system and method according to the present invention tests cable and determines status. The test module includes a pretest state machine that senses activity on the cable and enables testing if activity is not detected for a first period. A test state machine is enabled by the pretest state machine, transmits a test pulse on the cable, measures a reflection amplitude and calculates a cable length. The test module determines the cable status based on the measured amplitude and the calculated cable length.

In other features, the pretest state machine enables testing if, during the first period, activity is detected and is subsequently not detected for a second period after the activity is detected. A lookup table includes a plurality of sets of reflection amplitudes as a function of cable length. The test module determines the cable status using the lookup table, the reflection amplitude and the cable length.

In yet other features, the sets of reflection amplitudes define a plurality of windows. Three windows are defined by first and second thresholds. The first threshold is based on a first set of reflection amplitudes that are measured as a function of length when the test cable type is terminated using a first impedance having a first impedance value. The second threshold is based on a second set of reflection amplitudes that are measured as a function of length when the test cable type is terminated using a second impedance having a second impedance value.

In still other features, the cable is declared an open circuit when the reflection amplitude is within the first window for the calculated cable length. The cable is declared a short circuit when the reflection amplitude is within the second window for the calculated cable length. The cable is declared normal when the reflection amplitude is within the third window for the calculated cable length.

In still other features, when testing cable that transmits and receives on different wires, the test module transmits the test pulse, measures offset, subtracts the offset from the reflection amplitude, and detects peaks. If a second peak is not detected after a first peak and the reflection amplitude of the first peak is greater than a first threshold, the test module transmits a second test pulse having a second amplitude that is less than a first amplitude of the first test pulse. If the reflection amplitude of a first peak after transmitting the second test pulse is greater than a second threshold, the test module declares a close open status. If the first peak is detected after a predetermined period after transmitting the second test pulse, the test module declares an open status. If the first peak is less than a predetermined threshold within the predetermined period after transmitting the second test pulse, the test module declares a perfectly terminated status.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify the same elements.

Figure 2:
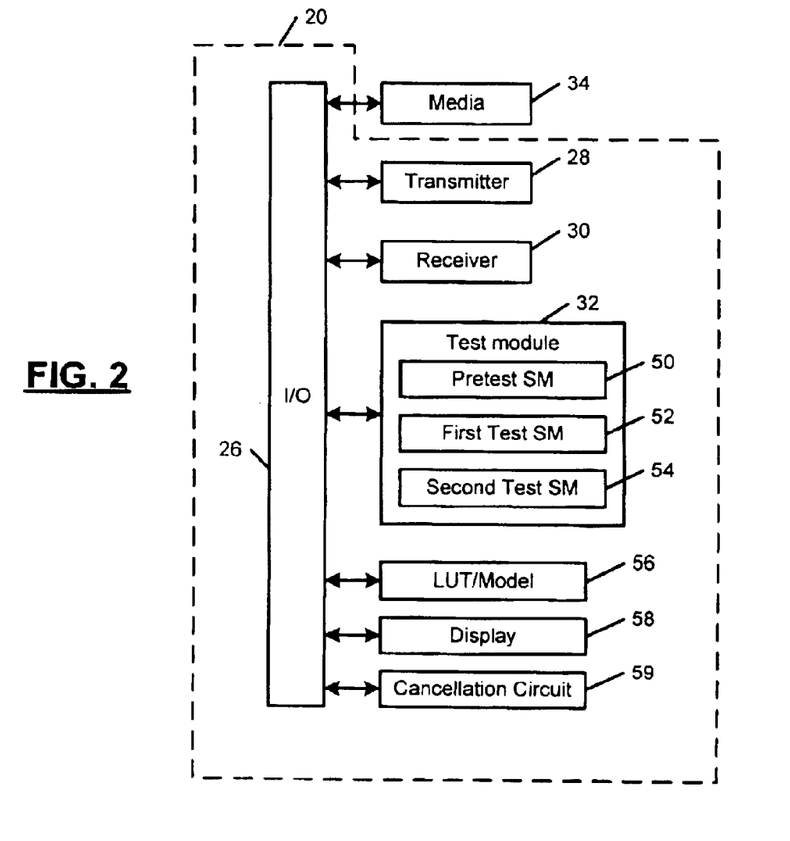
FIG. 2 is a functional block diagram of a cable tester according to the present invention.

Referring now to FIG. 2, a cable tester 20 according to the present invention is shown. The cable tester 20 is capable of testing 10/100BaseT cable, 1000BaseT cable, and/or other cable media. For example, 10/100BaseT includes two pairs of twisted pair wires and 1000BaseT cable includes four pairs of twisted pair wires. A transmitter 28 and a receiver 30 are coupled to the I/O interface 26. A test module 32 includes state machines for testing a media 34 such as cable. The test module 32 can be implemented in combinatorial logic, using discrete circuits, and/or using a processor and memory that executes testing software.

The test module 32 includes a pretest state machine 50. The test module 32 also includes a first test state machine 52 and/or a second test state machine 54. One or more lookup tables 56 containing cable empirical data are also provided as will be described below. The cable tester 20 may also include a display 58 for presenting fault status, cable length and/or reflection amplitude data. A cancellation circuit 59 cancels the test pulse when testing on media that transmits and receives on the same wire such as 1000BaseT. The cancellation circuit 59 is not used when testing media that transmits and receives on different wires such as in 10/100BaseT. The cancellation circuit 59 can be a hybrid circuit.

Figure 3:
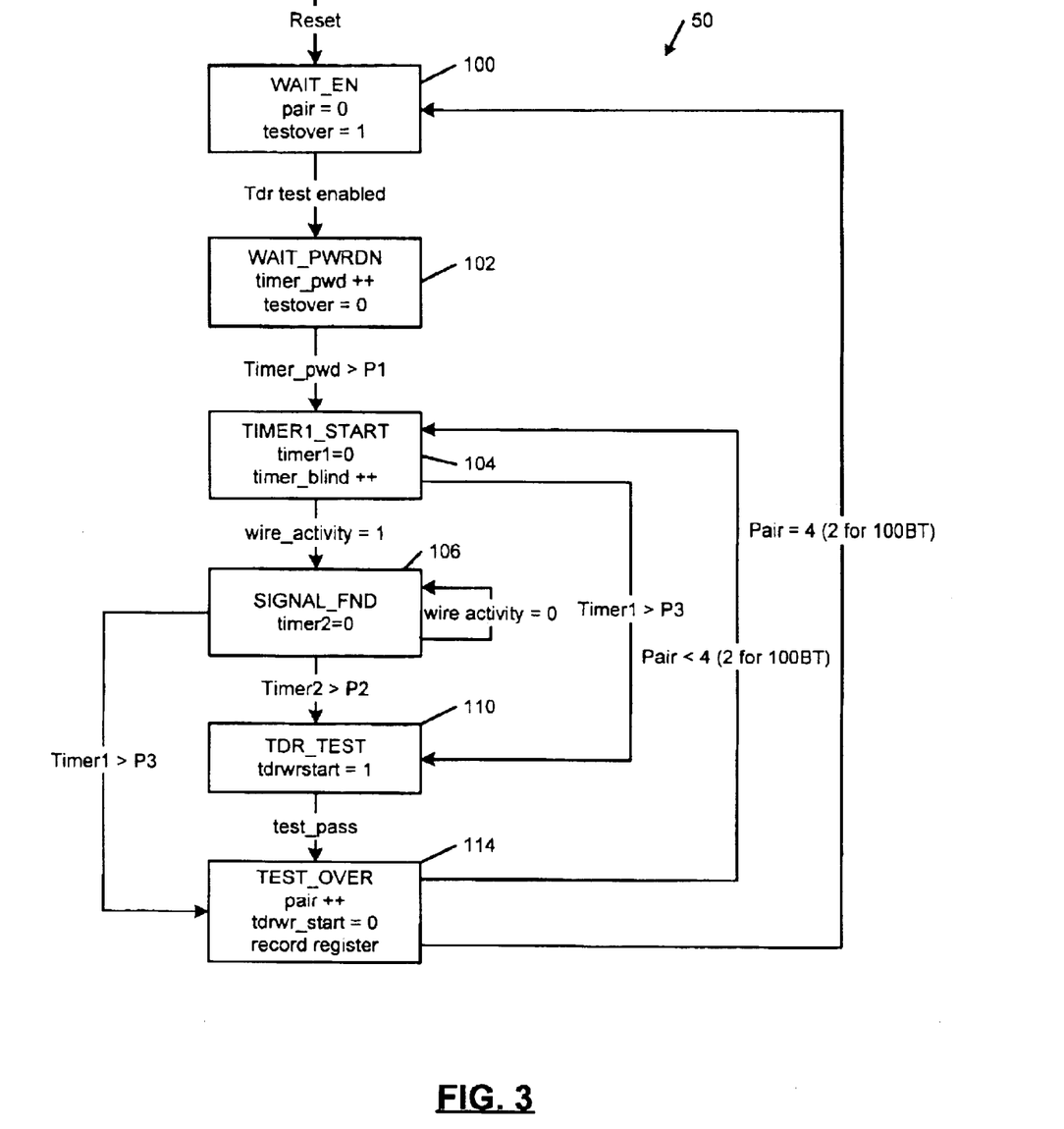
FIG. 3 is a state diagram of a pretest state machine.

Referring now to FIG. 3, the pretest state machine 50 is illustrated in further detail. On reset, the pretest state machine 50 moves to a wait enable state 100. Pair is set equal to zero and testover is set equal to one. When a test enabled signal is received, the pretest state machine 50 transitions to a wait powerdown state 102. A powerdown timer is incremented and test_over is set equal to zero. The powerdown timer should have a period that is sufficient to bring a link down. When the powerdown timer exceeds a first period P1, the pretest state machine 50 transitions to a first timer start state 104.

A first timer is set equal to zero and a blind timer is incremented. The blind timer waits for a blind timer period to allow a sufficient amount of time for transitions between pairs. Typically several clock cycles are sufficient. When wire_activity is high, the pretest state machine 50 transitions to a signal find state 106 and resets a second timer. Wire_activity is present when a signal on the wire is above a predetermined threshold.

When wire_activity is low in the signal find state 106, the pretest state machine 50 transitions back to the signal find state 106 and resets the second timer. If the second timer is greater than a second period P2, the pretest state machine 50 transitions to a test state 110. Tdrwrstart is set equal to one. If a test pass signal is received, the pretest state machine 50 transitions to a test over state 114. Pair is incremented, tdrwrstart is set equal to zero, and the register is recorded.

If pair is less than 4 for 1000BaseT operation or 2 for 10/100BaseT operation, the pretest state machine 50 transitions from the test over state 114 to the first timer start state 104. If pair is equal to 4 for 1000BaseT operation or 2 for 10/100BaseT operation, the pretest state machine 50 transitions from the test over state 114 to the wait enable state 100.

In the first timer start state 104, the pretest state machine 50 transitions to the test state 110 if the first timer is greater than a third period P3. In the signal find state 106, the pretest state machine 50 transitions to the test over state 114 if the first timer is greater than the third period P3.

In a preferred embodiment, the first period P1 is preferably 1.5 s, the second period P2 is equal to 5 ms, and the third period is equal to 125 ms. Skilled artisans will appreciate that the first, second and third periods P1, P2 and P3, respectively, may be varied. The P3 is preferably selected based on a worst case spacing of link pulses. P2 is preferably selected to allow testing between fast link pulses (FLP). FLP bursts have a length of 2 ms and a spacing of 16 ms. By setting P2=5 ms, the delay is a total of 7 ms, which is approximately half way between FLPs. P1 may be longer than 1.5 seconds if required to bring the link down.

Figure 4:
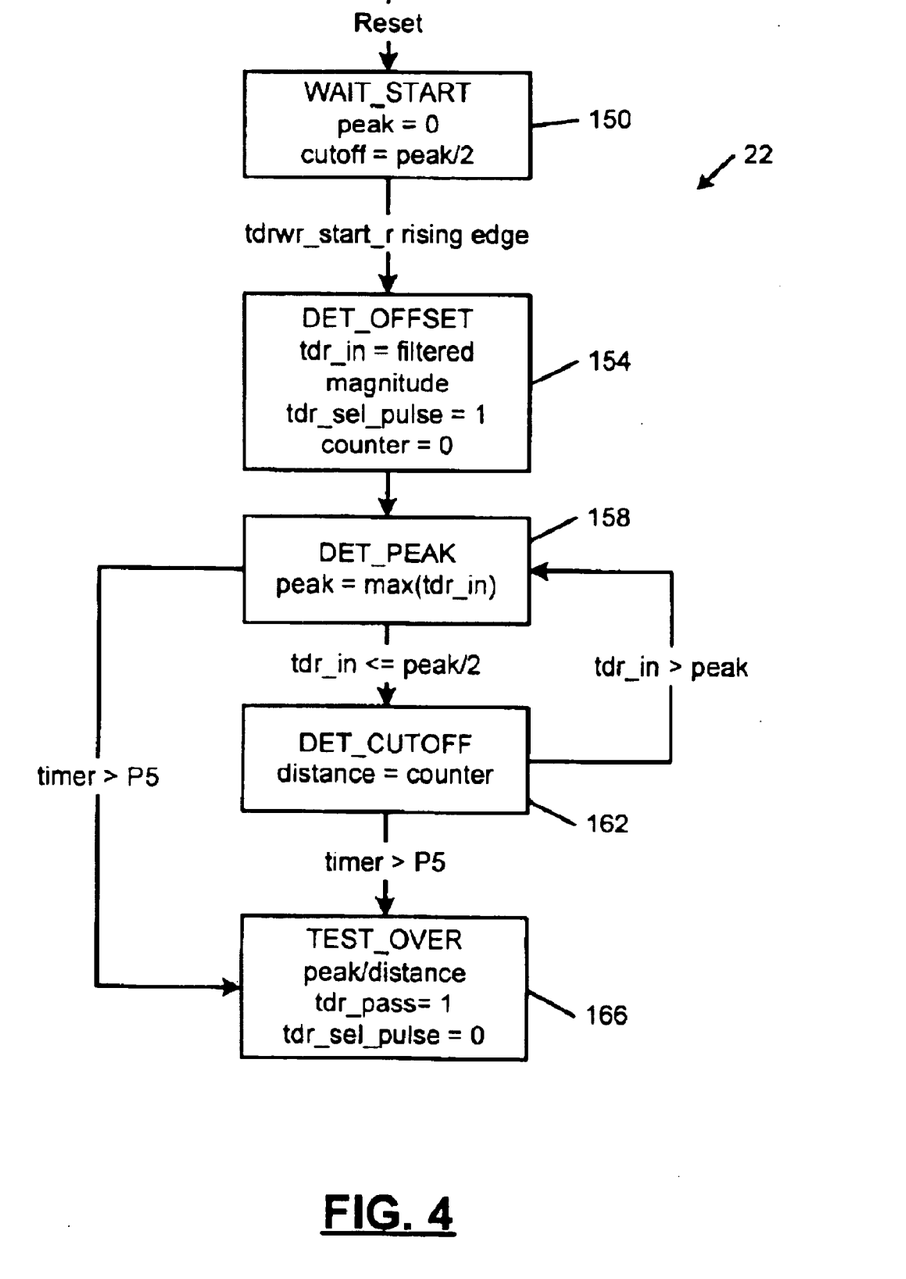
FIG. 4 is a state diagram of a first test state machine for a cable tester for a media that transmits and receives on the same wire.

Referring now to FIG. 4, the first test state machine 52 for media that transmits and receives on the same wire is shown. The cancellation circuit 59 cancels the transmit test pulse. On reset, the first test state machine 52 transitions to a wait start state 150. Peak is set equal to zero and cutoff is set equal to peak/2. When tdrwr_start_r rising edge is received from the pretest state machine 50, the first test state machine 52 transitions to a detect offset state 154. tdr_sel_pulse is set equal to 1 to generate a pulse and start a timer. The pulse is preferably a 128 ns pulse having a 2V amplitude.

After an offset is subtracted from tdr_in, the first test state machine 52 transitions to a detect peak state 158. Peak stores the current value of tdr_in. If tdr_in is less than or equal to peak/2, the first test state machine 52 transitions to a detect cutoff state 162 where distance is set equal to a counter. If tdr_in is greater than peak, the first test state machine 52 transitions to state 158 and peak is replaced by a new tdr_in. If a timer is greater than a fifth period P5, the first test state machine 52 transitions to a test over state 166 where peak/distance is calculated, tdr_pass is set equal to 1, and tdr_sel_pulse is set equal to 0.

While in the detect cutoff state 162, the first test state machine 52 transitions to the detect peak state 158 if tdr_in>peak. While in the detect peak state 158, the first state machine 52 transitions to the test over state 166 if the timer is greater than the fifth period P5. In a preferred embodiment, P5 is equal to 5 µs.

Figure 5:
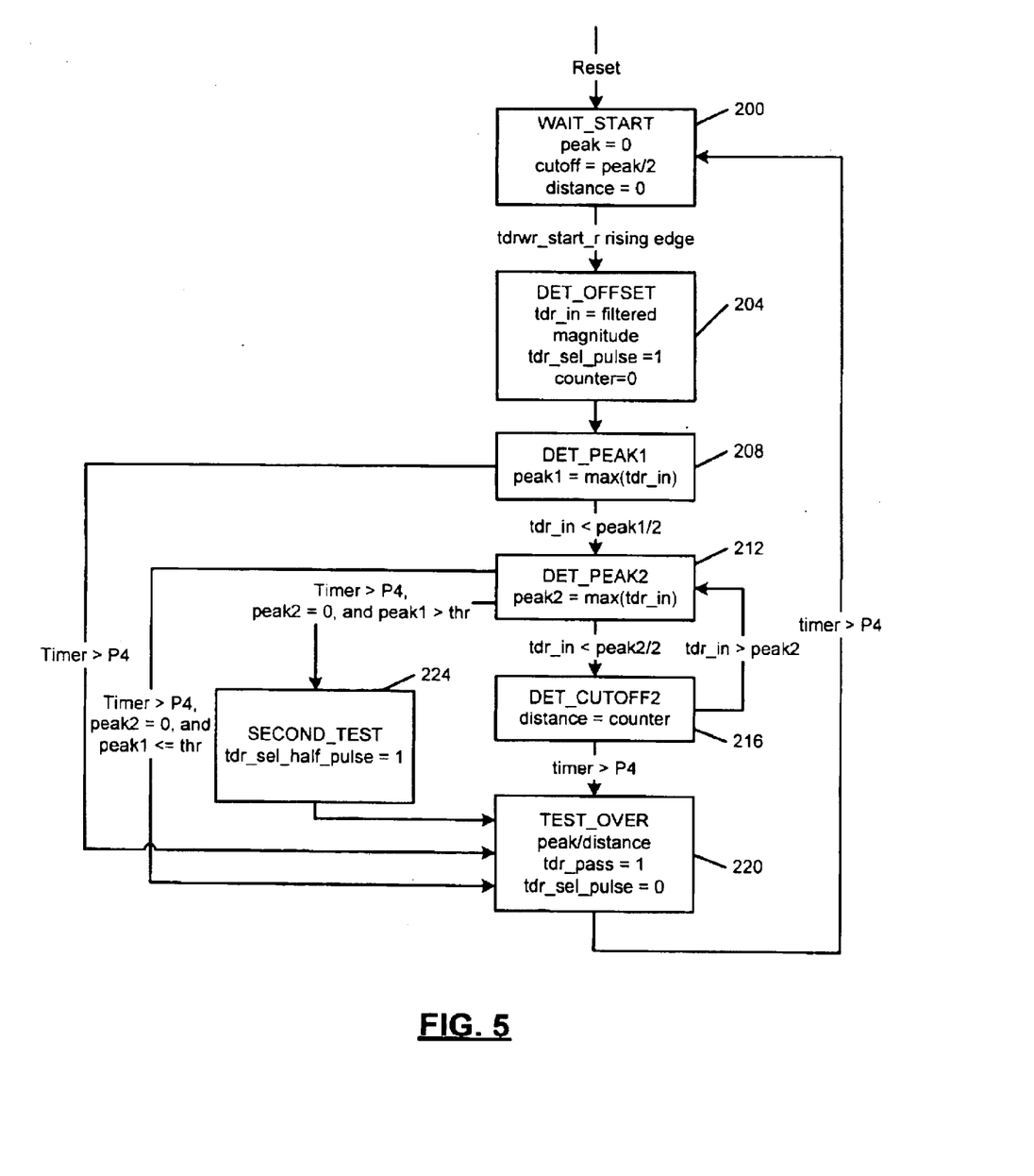
FIG. 5 is a state diagram of a second test state machine for a cable tester for a media that does not transmit and receive on the same wire.

Referring now to FIG. 5, the second test state machine 54 is shown in further detail. On reset, the second test state machine 54 transitions to a wait start state 200. Peak is set equal to zero, cutoff is set equal to peak/2, and distance is set equal to 0. When tdrwr_r rising edge is received from the pretest state machine 50, the second test state machine 54 transitions to a detect offset state 204 where tdr_in=filtered magnitude and tdr_sel_pulse is set equal to 1. The second test state machine 54 transitions to a first detect peak state 208 where peak 1 is set equal to max of tdr_in.

If tdr_in is less than peak 1/2, the second test state machine 54 transitions to a second detect peak state 212 and sets peak2 equal to maximum of tdr_in. If tdr_in is less than peak2/2, the second test state machine 54 transitions to a detect cutoff state 216. Distance is set equal to a counter. If a fourth timer is greater than a fourth period P4, the second test state machine 54 transitions to a test over state 220. Peak/distance is calculated, tdr_pass is set equal to 1, and tdr_sel_pulse is set equal to 0.

In the detect cutoff state 216, if tdr_in is greater than peak2, the second test state machine 54 transitions to the second peak detect state 212. In the second detect peak state 212, if the fourth timer is greater than P4, peak2 is equal to 0 and peak 1 is greater than a threshold, the second test state machine 54 transitions to a second test state 224. In the second test state 224, tdr_sel_half_pulse is set equal to 1 to send a half pulse. The second test state machine 54 transitions from the second test state 224 to the test over state 220.

In the first detect peak state 208, if the fourth timer is greater than P4, the second test state machine 54 transitions to the test over state 220. In the second detect peak state 212, if the fourth timer is greater than P4, peak2 =0, and peak1 is less than or equal to a second threshold, the second test state machine 54 transitions to the test over state 220.

The link is brought down and the pretest state machine 50 waits until the line is quiet. For each pair, the cable tester 20 generates a TDR pulse and measures the reflection. In 10/100BaseT media, after the test is enabled, the pretest state machine 50 waits until the line is quiet. A pulse is generated and the reflection is measured. The status receiver and transmitter pairs are determined sequentially. For the first pair, the receiver is preferably in MDIX mode and the transmitter is preferably in MDI mode. For the second pair, the receiver is preferably in MDI mode and transmitter is preferably in MDIX mode.

The pretest state machine 50 ensures that the line is quiet before the pulse is transmitted. After the test is enabled, the pretest state machine 50 waits P1 (such as 1.5 seconds or longer) to make sure that the link is brought down. The pretest state machine 50 determines whether there is activity on a first pair (MDI+/−[0] for 1000BaseT network devices and RX for 10/100BaseT products).

In a preferred embodiment, activity is found when activity minus systemic offset such as a noise floor that is calculated in states 154 and 204 is greater than a predetermined threshold. If there is no activity for P2 (such as 125 ms), the pretest state machine 50 proceeds to the test state and sends a pulse on the selected pair. If there is activity on the pair and the line is quiet for 5 ms afterwards, the pretest state machine proceeds to the test state. The test fail state is reached and a test failure declared if the line has not been quiet for more than 5 ms during a 125 ms period. If a test failure is declared on the first pair or the TDR test is completed for the pair, the same procedure is conducted on MDI+/−[1], MDI+/−[2], MDI+/−[3] sequentially for 1000BaseT devices and the TX pair for 10/100BaseT devices.

In 1000BaseT devices, the original 128 ns test pulse is cancelled by the cancellation circuit 59. The pulse received at the ADC output is the reflection. The test pulse preferably has 2V swing. Before testing, the offset on the line is measured and is subtracted from the received ADC value.

Figure 6:
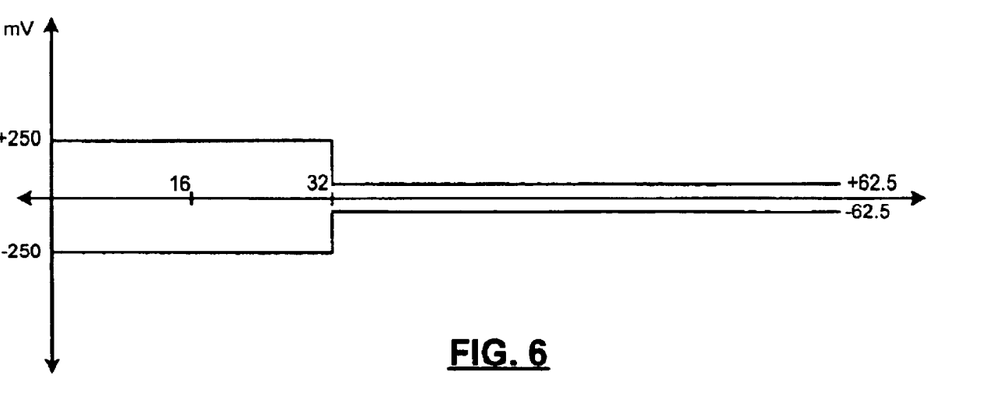
FIG. 6 is a waveform diagram illustrating a time-based receiver floor.

Referring now to FIG. 6, the cancellation circuit 59, which can be an analog hybrid circuit, does not perfectly cancel the test pulse. To prevent false reflection identification, a 250 mv floor within 32 clock cycles (125 Mhz clock) and a 62.5 mv floor after 32 clock cycles are used to allow a residual of cancellation of the test pulse and noise to be filtered. The peak value on the line is detected for 5 µs. The amplitude of reflection is the maximum magnitude that is detected. The amplitude is adjusted according to the sign of the reflection. The distance to the reflection is located at 50% of the peak.

Figure 7:
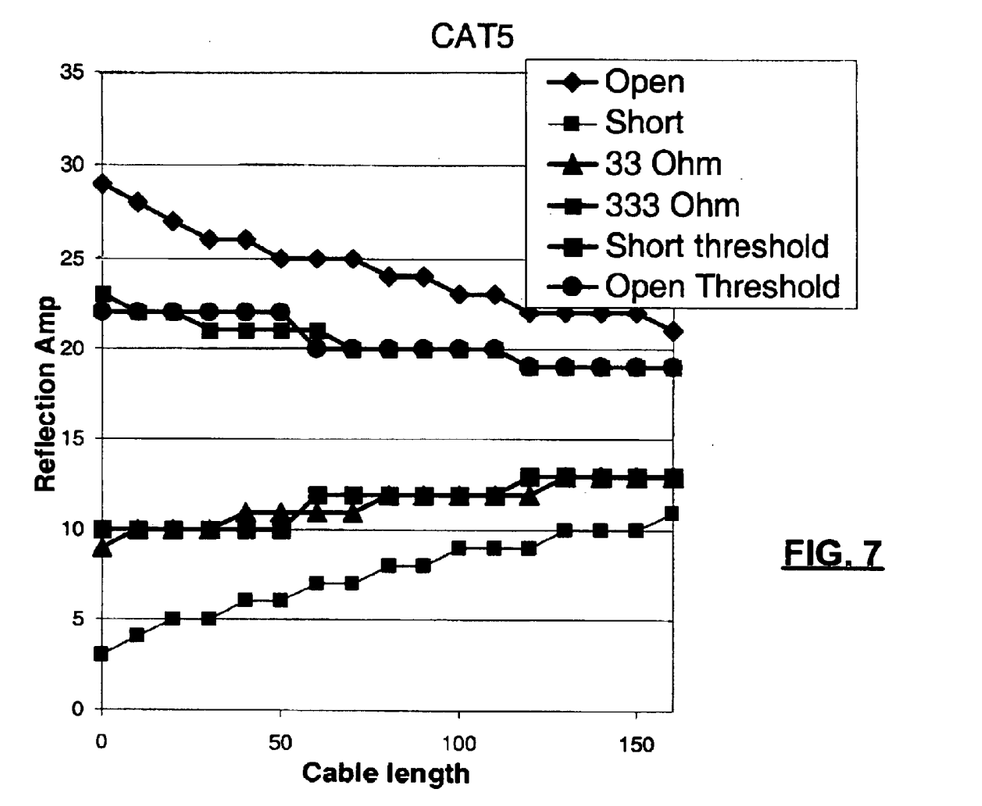
FIG. 7 is an exemplary cable reflection amplitude vs. cable length relationship for a first type of cable.

The cable status is determined by comparing the amplitude and the calculated cable length to the lookup table 56 for the type of cable being tested. The measured reflection amplitude falls into a window. There are two adjustable thresholds for open circuit and short circuit cables. The open threshold is preferably based on experimental data, which can be produced by refection amplitudes for CAT3 and CAT5 cable that is terminated with a first impedance value such as 333 Ohms.

The default short circuit threshold is based on experimental data of refection amplitudes for CAT3 and CAT5 cable that is terminated with a second impedance value such as a 33 Ohms. As can be appreciated, the lookup table 56 may contain data for other cable types. Other impedance values may be used to generate the thresholds.

If measured amplitude falls between open and short circuit thresholds, the cable status is declared normal. If the amplitude is above the open threshold, the cable status is declared an open circuit. If the amplitude is below a short circuit threshold, the cable status is declared a short circuit. The cable status, reflection amplitude and cable distance are stored and/or displayed.

In the second test state machine, the original test pulse is not cancelled. Both the original pulse and the reflection are monitored. When an open circuit is located near the cable tester, the two pulses may be overlapping, which may cause saturation in the ADC. The test state machine preferably sends out a 128 ns pulse that has a 1V swing. The offset on the line is measured and subtracted from the received ADC value. A 250 mv floor is used within 32 clock cycles (125 Mhz clock) and a 62.5 mv floor is used after 32 clock cycles so that the residual of cancellation and noise can be filtered. Signals below the floor are considered to be 0. The peak value on the line is detected for 5 µs. As can be appreciated, the test pulse can have longer or shorter durations and amplitudes.

The first peak that is observed should be the test pulse. The amplitude of reflection is the maximum magnitude detected after the test pulse is detected. The distance of reflection is at 50% cutoff of the peak. If another pulse is not detected after the test pulse and the magnitude of the test pulse is greater than a preset threshold, the cable tester identifies an open cable that is located relatively close. A second test transmits a second test pulse that has one-half of the magnitude of the first test pulse.

If the maximum magnitude on the line is greater than ¾ of the original pulse, there is an open circuit that is located relatively close. Otherwise, if the first peak is detected after 26 clock cycles, the cable tester 20 declares an open circuit. If the first peak is within 26 clock cycles, the cable tester 20 declares a perfectly terminated cable.

The cable status is determined by comparing the amplitude and distance of reflection to the lookup table 56 based on the type of cable being tested. There are two adjustable thresholds for open and short circuit cables. The default open threshold is from the experimental data of refection amplitudes for CAT3 and CAT5 cable terminated with a first impedance value such as 333 Ohms. The default short circuit threshold is from the experimental data of refection amplitude of CAT3 and CAT5 cable that is terminated with a second impedance value such as 33 Ohms. Other impedance values may be employed for generating thresholds.

If the measured amplitude falls between open and short circuit thresholds, the cable status is declared normal. If the amplitude is above the open circuit threshold, the cable status is declared an open circuit. If the amplitude is below a short circuit threshold, the cable status is declared a short circuit. The cable status, reflection amplitude and cable length are stored and/or displayed.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A cable tester that tests cable and that determines a cable status, comprising:
    a test module including:
    a pretest state machine that senses activity on a first pair of said cable and enables testing if activity is not detected for a first period; and
    a test state machine that is enabled by said pretest state machine, transmits a test pulse on said cable, measures a reflection amplitude and calculates a cable length,
    wherein said test module determines said status based on said measured amplitude and said calculated cable length, and
    wherein said pretest state machine enables testing of said first pair if, during said first period, activity is detected on said first pair and is subsequently not detected on said first pair for a second period after said activity is detected.

2. The cable tester of claim 1 further comprising a lookup table that includes a plurality of sets of reflection amplitudes as a function of cable length, wherein said test module determines said status using said lookup table, said reflection amplitude and said cable length.

3. The cable tester of claim 1 wherein said status includes open circuit and short status.

4. The cable tester of claim 1 further comprising an indicator for displaying at least one of said status, said calculated cable length and said measured reflection amplitude.

5. The cable tester of claim 1 wherein said cable tester has a test fail status when said cable is active for a period greater than a test fail period.

6. The cable tester of claim 1 wherein said cable tester is implemented in a network device.

7. The cable tester of claim 1 wherein said cable tester is implemented in a physical layer device.

8. The cable tester of claim 1 wherein said cable tester is integrated with a physical layer device in a single integrated circuit.

9. A cable tester that tests cable and that determines a cable status, comprising:
    a test module including:
    a pretest state machine that senses activity on said cable and enables testing if activity is not detected for a first period; and
    a test state machine that is enabled by said pretest state machine, transmits a test pulse in said cable, measures a reflection amplitude and calculates a cable length,
    a lookup table that includes a plurality of sets of reflection amplitudes as a function of cable length, wherein said test module determines said status using said lookup table, said reflection amplitude and said cable length, wherein said test module determines said status based on said measured amplitude and said calculated cable length, and
    wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

10. The cable tester of claim 9 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

11. The cable tester of claim 10 wherein a third window is defined between said second and fourth thresholds.

12. The cable tester of claim 11 wherein said cable is declared an open circuit when said reflection amplitude is in said first window for said cable length and wherein said cable is declared a short circuit when said reflection amplitude is in said second window for said cable length, and wherein said cable is declared normal when said reflection amplitude is in said third window for said cable length.

13. A cable tester that tests cable and that determines a cable status, comprising:
    a test module including:
    a pretest state machine that senses activity on said cable and enables testing if activity is not detected for a first period; and
    a test state machine that is enabled by said pretest state machine, transmits a test pulse on said cable, measures a reflection amplitude and calculates a cable length,
    wherein said test module determines said status based on said measured amplitude and said calculated cable length,
    wherein said test module transmits said test pulse, measures offset, subtracts said offset from said reflection amplitude, and detects peaks, and wherein if a second peak is not detected after a first peak and said reflection amplitude of said first peak is greater than a first threshold, said test module transmits a second test pulse having a second amplitude that is less than a first amplitude of said first test pulse.

14. The cable tester of claim 13 wherein if said reflection amplitude of a first peak after transmitting said second test pulse is greater than a second threshold, said test module declares a close open status wherein if said first peak is detected after a predetermined period after transmitting said second test pulse, said test module declares an open status.

15. The cable tester of claim 14 wherein if said first peak is not detected within said predetermined period after transmitting said second test pulse, said test module declares a perfectly terminated status.

16. The cable tester of claim 15 further comprising a cancellation circuit that cancels said test pulse when said cable transmits and receives on a common wire.

17. The cable tester of claim 13 wherein said second amplitude is approximately one-half of said first amplitude.

18. A cable tester that tests cable and that determines a cable status, comprising:
a test module including:
a pretest state machine that senses activity on said cable and enables testing if activity is not detected for a first period;
a test state machine that is enabled by said pretest state machine, transmits a test pulse on said cable, measures a reflection amplitude and calculates a cable length, wherein said test module determines said status based on said measured amplitude and said calculated cable length; and
an analog to digital converter (ADC) that measures said reflection amplitude, wherein said test module measures offset at said ADC, subtracts said offset from said reflection amplitude, and zeroes said reflection amplitude below a floor.

19. The cable tester of claim 18 wherein said floor has a first value during a first period after said test pulse and a second value during a second period after said first period.

20. A method of testing cable to determine a cable status, comprising:
sensing activity on a first pair of said cable;
enabling testing on said first pair if said activity is not detected on said first pair for a first period:
transmitting a test pulse on said first pair of said cable;
measuring a reflection amplitude;
calculating a cable length; and
determining said cable status based on said measured amplitude and said calculated cable length, wherein said enabling step enables testing of said first pair if, during said first period, activity is detected on said first pair and is subsequently not detected on said first pair for a second period after said activity is detected.

21. The method of claim 20 further comprising:
using a lookup table that includes a plurality of sets of reflection amplitudes as a function of cable length; and
determining said status using said lookup table, said reflection amplitude and said cable length.

22. The method of claim 20 wherein said status includes open circuit and short status.

23. The method of claim 20 further comprising displaying at least one of said status, said calculated cable length and said measured reflection amplitude.

24. The method of claim 20 further comprising:
generating a test fail status when said cable is active for a period greater than a test fail period.

25. The method of claim 20 further comprising implementing a cable tester in a network device.

26. The method of claim 20 further comprising implementing a cable tester in a physical layer device.

27. The method of claim 20 further comprising implementing a cable tester and a physical layer device in a single integrated circuit.

28. A method of testing cable to determine a cable status, comprising:
sensing activity on said cable;
enabling testing if said activity is not detected for a first period;
transmitting a test pulse on said cable;
measuring a reflection amplitude;
calculating a cable length;
determining said cable status based on said measured amplitude and said calculated cable length;
using a lookup table that includes a plurality of sets of reflection amplitudes as a function of cable length; and
determining said status using said lookup table, said reflection amplitude and said cable length,
wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

29. The method of claim 28 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

30. The method of claim 29 wherein a third window is defined between said second and fourth thresholds.

31. The method of claim 30 further comprising:
declaring said cable an open circuit when said reflection amplitude is within said first window for said cable length;
declaring said cable a short circuit when said reflection amplitude is within said second window for said cable length; and
declaring said cable normal when said reflection amplitude is within said third window for said cable length.

32. A method of testing cable to determine a cable status, comprising:
sensing activity on said cable;
enabling testing if said activity is not detected for a first period;
transmitting a test pulse on said cable;
measuring a reflection amplitude;
calculating a cable length;
determining said cable status based on said measured amplitude and said calculated cable length;
measuring offset;
subtracting said offset from said reflection amplitude; and detecting peaks, wherein if a second peak is not detected after a first peak and said reflection amplitude of said first peak is greater than a first threshold, said test module transmits a second test pulse having a second amplitude that is less than a first amplitude of said first test pulse.

33. The method of claim 32 further comprising:

declaring a close open status if said reflection amplitude of a first peak after transmitting said second test pulse is greater than a second threshold; and declaring an open status if said first peak is detected after a predetermined period after transmitting said second test pulse.

34. The method of claim 33 further comprising:

declaring a perfectly terminated status if said first peak is not detected within said predetermined period after transmitting said second test pulse.

35. The method of claim 34 further comprising canceling said test pulse when said cable transmits and receives on a common wire.

36. The method of claim 32 wherein said second amplitude is approximately one-half of said first amplitude.

37. A method of testing cable to determine a cable status, comprising:

sensing activity on said cable;

enabling testing if said activity is not detected for a first period;

transmitting a test pulse on said cable;

measuring a reflection amplitude;

calculating a cable length;

determining said cable status based on said measured amplitude and said calculated cable length;

measuring said reflection amplitude;

measuring offset;

subtracting said offset from said reflection amplitude; and setting said reflection amplitude below a floor equal to zero.

38. The method of claim 37 wherein said floor has a first value during a first period after said test pulse and a second value during a second period after said first period.

39. A cable tester that tests cable and that determines a cable status, comprising:

test module means for testing a first pair of said cable, wherein said test module means includes:

pretest means for sensing activity on said first pair of said cable and for enabling testing on said first pair if activity is not detected for a first period; and test means that is enabled by said pretest means for transmitting a test pulse on said cable, for measuring a reflection amplitude and for calculating a cable length, wherein said test module means determines said status based on said measured amplitude and said calculated cable length, and wherein said pretest means enables testing on said first pair if, during said first period, activity is detected on said first pair and is subsequently not detected on said first pair for a second period after said activity is detected.

40. The cable tester of claim 39 further comprising a lookup means for storing a plurality of sets of reflection amplitudes as a function of cable length, wherein said test module means determines said status using said lookup means, said reflection amplitude and said cable length.

41. The cable tester of claim 39 wherein said status includes open circuit and short status.

42. The cable tester of claim 39 further comprising an indicator means for displaying at least one of said status, said calculated cable length and said measured reflection amplitude.

43. The cable tester of claim 39 wherein said cable tester has a test fail status when said cable is active for a period greater than a test fail period.

44. The cable tester of claim 39 wherein said cable tester is implemented in a network device.

45. The cable tester of claim 39 wherein said cable tester is implemented in a physical layer device.

46. The cable tester on claim 39 wherein said cable tester is integrated with a physical layer device in a single integrated circuit.

47. A cable tester that tests cable and that determines a cable status, comprising:

test module means for testing said cable, wherein said test module means includes:

pretest means for sensing activity on said cable and for enabling testing if activity is not detected for a first period;

test means that is enabled by said pretest means for transmitting a test pulse on said cable, for measuring a reflection amplitude and for calculating a cable length, wherein said test module means determines said status based on said measured amplitude and said calculated cable length; and a lookup means for storing a plurality of sets of reflection amplitudes as a function of cable length, wherein said test module means determines said status using said lookup means, said reflection amplitude and said cable length, wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

48. The cable tester of claim 47 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

49. The cable tester of claim 48 wherein a third window is defined between said second and fourth thresholds.

50. The cable tester of claim 49 wherein said cable is declared an open circuit when said reflection amplitude is in said first window for said cable length and wherein said cable is declared a short circuit when said reflection amplitude is in said second window for said cable length, and wherein said cable is declared normal when said reflection amplitude is in said third window for said cable length.

51. A cable tester that tests cable and that determines a cable status, comprising:

test module means for testing said cable, wherein said test module means includes:

pretest means for sensing activity on said cable and for enabling testing if activity is not detected for a first period; and test means that is enabled by said pretest means for transmitting a test pulse on said cable, for measuring a reflection amplitude and for calculating a cable length, wherein said test module means determines said status based on said measured amplitude and said calculated cable length, and wherein said test module means transmits said test pulse, measures offset, subtracts said offset from said reflection amplitude, and detects peaks wherein if a second peak is not detected after a first peak and said reflection amplitude of said first peak is greater than a first threshold, said test module means transmits a second test pulse having a second amplitude that is less than a first amplitude of said first test pulse.

52. The cable tester of claim 51 wherein if said reflection amplitude of a first peak after transmitting said second test pulse is greater than a second threshold, said test module means declares a close open status wherein if said first peak is detected after a predetermined period after transmitting said second test pulse, said test module means declares an open status.

53. The cable tester of claim 52 wherein if said first peak is not detected within said predetermined period after transmitting said second test pulse, said test module means declares a perfectly terminated status.

54. The cable tester of claim 53 further comprising a cancellation means for canceling said test pulse when said cable transmits and receives on a common wire.

55. The cable tester of claim 51 wherein said second amplitude is approximately one-half of said first amplitude.

56. A cable tester that tests cable and that determines a cable status, comprising:
   test module means for testing said cable, wherein said test module means includes:
   pretest means for sensing activity on said cable and for enabling testing if activity is not detected for a first period;
   test means that is enabled by said pretest means for transmitting a test pulse on said cable, for measuring a reflection amplitude and for calculating a cable length, wherein said test module means determines said status based on said measured amplitude and said calculated cable length; and
   an analog to digital converting means (ADC) for measuring said reflection amplitude, wherein said test module means measures offset at said ADC, subtracts said offset from said reflection amplitude, and zeroes said reflection amplitude below a floor.

57. The cable tester of claim 56 wherein said floor has a first value during a first period after said test pulse and a second value during a second period after said first period.

58. A network comprising:
   a first network device with a first physical layer;
   a cable that includes a first pair and that communicates with said first physical layer;
   a second network device with a second physical layer that communicates with said cable,
   wherein said first physical layer includes a cable tester that tests said first pair of said cable, that determines a cable status and that includes:
      a test module including:
         a pretest state machine that senses activity on said first pair of said cable and enables testing if activity is not detected on said first pair for a first period; and
         a test state machine that is enabled by said pretest state machine, transmits a test pulse on said cable, measures a reflection amplitude and calculates a cable length, wherein said test module determines a cable status based on said measured amplitude and said calculated cable length, and
      wherein said pretest state machine enables testing on said first pair if, during said first period, activity is detected on said first pair and is subsequently not detected on said first pair for a second period after said activity is detected.

59. The network of claim 58 further comprising a lookup table that includes a plurality of sets of reflection amplitudes as a function of cable length, wherein said test module determines said cable status using said lookup table, said reflection amplitude and said cable length.

60. The network of claim 58 wherein said cable status includes open circuit and short status.

61. The network of claim 58 further comprising an indicator for displaying at least one of said status, said calculated cable length and said measured reflection amplitude.

62. The network of claim 58 wherein said cable tester has a test fail status when said cable is active for a period greater than a test fail period.

63. A network comprising:
   a first network device with a first physical layer;
   a cable that communicates with said first physical layer;
   a second network device with a second physical layer that communicates with said cable,
   wherein said first physical layer includes a cable tester that tests said cable, that determines a cable status and that includes:
      a test module including:
         a pretest state machine that senses activity on said cable and enables testing if activity is not detected for a first period;
         a test state machine that is enabled by said Pretest state machine, transmits a test pulse on said cable, measures a reflection amplitude and calculates a cable length, wherein said test module determines a cable status based on said measured amplitude and said calculated cable length,
      a lookup table that includes a plurality of sets of reflection amplitudes as a function of cable length, wherein said test module determines said cable status using said lookup table, said reflection amplitude and said cable length,
   wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

64. The network of claim 63 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

65. The network of claim 64 wherein a third window is defined between said second and fourth thresholds.

66. The network of claim 65 wherein said cable is declared an open circuit when said reflection amplitude is within said first window for said cable length and wherein said cable is declared a short circuit when said reflection amplitude is within said second window for said cable length, and wherein said cable is declared normal when said reflection amplitude is within said third window for said cable length.

67. A network comprising:
- a first network device with a first physical layer;
- a cable that communicates with said first physical layer;
- a second network device with a second physical layer that communicates said cable,
- wherein said first physical layer includes a cable tester that tests said cable, that determines a cable status and that includes:
  - a test module including:
  - a pretest state machine that senses activity on said cable and enables testing if activity is not detected for a first period; and
  - a test state machine that is enabled by said pretest state machine, transmits a test pulse on said cable, measures a reflection amplitude and calculates a cable length, wherein said test module determines a cable status based on said measured amplitude and said calculated cable length,
  - wherein said test module transmits said test pulse, measures offset, subtracts said offset from said reflection amplitude, and detects peaks, and wherein if a second peak is not detected after a first peak and said reflection amplitude of said first peak is greater than a first threshold, said test module transmits a second test pulse having a second amplitude that is less than a first amplitude of said first test pulse.

68. The network of claim 67 wherein if said reflection amplitude of a first peak after transmitting said second test pulse is greater than a second threshold, said test module declares a close open status wherein if said first peak is detected after a predetermined period after transmitting said second test pulse, said test module declares an open status.

69. The network of claim 68 wherein if said first peak is not detected within said predetermined period after transmitting said second test pulse, said test module declares a perfectly terminated status.

70. The network of claim 69 further comprising a cancellation circuit that cancels said test pulse when said cable transmits and receives on a common wire.

71. The network of claim 67 wherein said second amplitude is approximately one-half of said first amplitude.

72. A network comprising:
- a first network device with a first physical layer;
- a cable that communicates with said first physical layer;
- a second network device with a second physical layer that communicates with said cable,
- wherein said first physical layer includes a cable tester that tests said cable, that determines a cable status and that includes:
  - a test module including:
  - a pretest state machine that senses activity on said cable and enables testing if activity is not detected for a first period;
  - a test state machine that is enabled by said pretest state machine, transmits a test pulse on said cable, measures a reflection amplitude and calculates a cable length, wherein said test module determines a cable status based on said measured amplitude and said calculated cable length; and
  - an analog to digital converter (ADC) that measures said reflection amplitude, wherein said test module measures offset at said ADC, subtracts said offset from said reflection amplitude, and zeroes said reflection amplitude below a floor.

73. The network of claim 72 wherein said floor has a first value during a first period after said test pulse and a second value during a second period after said first period.

74. A network comprising:
- a first network device with a first physical layer;
- a cable that communicates with said first physical layer;
- a second network device with a second physical layer that communicates with said first physical layer over said cable,
- wherein said first physical layer includes a cable tester that tests a first pair of said cable, that determines a cable status and that includes:
  - test module means for testing said cable, wherein said test module means includes:
  - pretest means for sensing activity on said first pair of said cable and for enabling testing on said first pair if activity is not detected for a first period; and
  - test means that is enabled by said pretest means for transmitting a test pulse on said cable, for measuring a reflection amplitude and for calculating a cable length, wherein said test module means determines a cable status based on said measured amplitude and said calculated cable length,
  - wherein said pretest means enables testing on said first pair if, during said first period, activity is detected on said first pair and is subsequently not detected on said first pair for a second period after said activity is detected.

75. The network of claim 74 further comprising a lookup means for storing a plurality of sets of reflection amplitudes as a function of cable length, wherein said test module means determines said cable status using said lookup means, said reflection amplitude and said cable length.

76. The network of claim 74 wherein said cable status includes open circuit and short status.

77. The network of claim 74 wherein said cable tester has a test fail status when said cable is active for a period greater than a test fail period.

78. A network comprising:
- a first network device with a first physical layer;
- a cable that communicates with said first physical layer;
- a second network device with a second physical layer that communicates with said first physical layer over said cable,
- wherein said first physical layer includes a cable tester that tests said cable, that determines a cable status and that includes:
  - test module means for testing said cable, wherein said test module means includes:
  - pretest means for sensing activity on said cable and for enabling testing if activity is not detected for a first period;
  - test means that is enabled by said pretest means for transmitting a test pulse on said cable, for measuring a reflection amplitude and for calculating a cable length, wherein said test module means determines a cable status based on said measured amplitude and said calculated cable length; and
  - a lookup means for storing a plurality of sets of reflection amplitudes as a function of cable length, wherein said test module means determines said cable status using said lookup means, said reflection amplitude and said cable length,
wherein said sets of reflection amplitudes define a plurality of windows including a first window that is defined by first and second thresholds, wherein said first threshold is based on a first set of reflection amplitudes that are measured as a function of cable length when a test cable type is an open circuit, and wherein said second threshold is based on a second set of reflection amplitudes that are measured as a function of cable length when said test cable type is terminated using a first impedance having a first impedance value.

79. The network of claim 78 wherein a second window is defined by third and fourth thresholds, wherein said third threshold is based on a third set of reflection amplitudes that are measured as a function of cable length when said test cable type is a short circuit, wherein said fourth threshold is based on a fourth set of reflection amplitudes that are measured as a function of cable length when said test cable type is terminated using a second impedance having a second impedance value.

80. The network of claim 79 wherein a third window is defined between said second and fourth thresholds.

81. The network of claim 80 wherein said cable is declared an open circuit when said reflection amplitude is in said first window for said cable length and wherein said cable is declared a short circuit when said reflection amplitude is in said second window for said cable length, and wherein said cable is declared normal when said reflection amplitude is in said third window for said cable length.

82. A network comprising:
a first network device with a first physical layer;
a cable that communicates with said first physical layer;
a second network device with a second physical layer that communicates with said first physical layer over said cable,
wherein said first physical layer includes a cable tester that tests said cable, that determines a cable status and that includes:
test module means for testing said cable, wherein said test module means includes:
pretest means for sensing activity on said cable and for enabling testing if activity is not detected for a first period;
test means that is enabled by said pretest means for transmitting a test pulse on said cable, for measuring a reflection amplitude and for calculating a cable length, wherein said test module means determines a cable status based on said measured amplitude and said calculated cable length; and indicator means for displaying at least one of said status, said calculated cable length and said measured reflection amplitude.

83. A network comprising:
a first network device with a first physical layer;
a cable that communicates with said first physical layer;
a second network device with a second physical layer that communicates with said first physical layer over said cable,
wherein said first physical layer includes a cable tester that tests said cable, that determines a cable status and that includes:
test module means for testing said cable, wherein said test module means includes:
pretest means for sensing activity on said cable and for enabling testing if activity is not detected for a first period; and
test means that is enabled by said pretest means for transmitting a test pulse on said cable, for measuring a reflection amplitude and for calculating a cable length,
wherein said test module means determines a cable status based on said 5measured amplitude and said calculated cable length,
wherein said test module means transmits said test pulse, measures offset, subtracts said offset from said reflection amplitude, and detects peaks, and wherein if a second peak is not detected after a first peak and said reflection amplitude of said first peak is greater than a first threshold, said test module means transmits a second test pulse having a second amplitude that is less than a first amplitude of said first test pulse.

84. The network of claim 83 wherein if said reflection amplitude of a first peak after transmitting said second test pulse is greater than a second threshold, said test module means declares a close open status wherein if said first peak is detected after a predetermined period after transmitting said second test pulse, said test module means declares an open status.

85. The network of claim 84 wherein if said first peak is not detected within said predetermined period after transmitting said second test pulse, said test module means declares a perfectly terminated status.

86. The network of claim 85 further comprising a cancellation means for canceling said test pulse when said cable transmits and receives on a common wire.

87. The network of claim 83 wherein said second amplitude is approximately one-half of said first amplitude.

88. A network comprising:
a first network device with a first physical layer;
a cable that communicates with said first physical layer;
a second network device with a second physical layer that communicates with said first physical layer over said cable,
wherein said first physical layer includes a cable tester that tests said cable, that determines a cable status and that includes:
test module means for testing said cable, wherein said test module means includes:
pretest means for sensing activity on said cable and for enabling testing if activity is not detected for a first period;
test means that is enabled by said pretest means for transmitting a test pulse on said cable, for measuring a reflection amplitude and for calculating a cable length, wherein said test module means determines a cable status based on said measured amplitude and said calculated cable length; and
an analog to digital converting means (ADC) for measuring said reflection amplitude, wherein said test module means measures offset at said ADC, subtracts said offset from said reflection amplitude, and zeroes said reflection amplitude below a floor.

89. The network of claim 88 wherein said floor has a first value during a first period after said test pulse and a second value during a second period after said first period.

* * * * *